US010983546B1

(12) United States Patent
Grave et al.

(10) Patent No.: US 10,983,546 B1
(45) Date of Patent: Apr. 20, 2021

(54) CIRCUITS AND METHODS PROVIDING BANDGAP CALIBRATION

(71) Applicant: QUALCOMM Incorporated, San Diego, CA (US)

(72) Inventors: Baptiste Grave, Douglas (IE); Keith Anthony O'Donoghue, Carrigaline (IE)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/720,285

(22) Filed: Dec. 19, 2019

(51) Int. Cl.
*G03F 3/02* (2006.01)
*G05F 1/10* (2006.01)
*G05F 3/26* (2006.01)

(52) U.S. Cl.
CPC .................................... *G05F 3/267* (2013.01)

(58) Field of Classification Search
CPC . G05F 3/30; G05F 3/267; G05F 3/262; G05F 3/205; G11C 5/147
USPC .......................... 327/539; 323/313, 315–316
See application file for complete search history.

(56) References Cited

U.S. PATENT DOCUMENTS

| | | | | |
|---|---|---|---|---|
| 10,663,994 B2 * | 5/2020 | Lin | ......................... | G05F 1/468 |
| 10,677,664 B1 * | 6/2020 | Wong | ....................... | G01K 7/01 |
| 2008/0191794 A1 * | 8/2008 | Chiu | .................. | H03H 11/1291 327/553 |
| 2014/0145701 A1 * | 5/2014 | Temkine | ................... | G05F 3/30 323/314 |

* cited by examiner

*Primary Examiner* — Quan Tra
(74) *Attorney, Agent, or Firm* — Qualcomm Incorporated

(57) ABSTRACT

A system includes a bandgap voltage generator coupled to a voltage supply and configured to produce a plurality of reference voltage levels in response to a plurality of calibration codes; an analog-to-digital converter (ADC) coupled to a reference voltage output of the bandgap voltage generator; a logic circuit coupled to an output of the ADC; a first memory element coupled to the logic circuit and configured to store a calibration coefficient indicative of a relationship of the calibration codes and the reference voltage levels; and a second memory element coupled to the logic circuit and configured to store a value of a first reference voltage level for the reference voltage output, wherein the logic circuit is configured to generate a first calibration code from the value of the first reference voltage level and the calibration coefficient.

24 Claims, 7 Drawing Sheets

CIRCUITS AND METHODS PROVIDING BANDGAP CALIBRATION

CROSS REFERENCE TO RELATED PATENT APPLICATION

This application is related to U.S. Patent Application entitled, “Circuits and Methods Providing Bandgap Calibration for Multiple Outputs,” filed on even date herewith and herein incorporated by reference in its entirety.

TECHNICAL FIELD

The present application relates, generally, to calibration of on-chip components and, more specifically, to calibration of bandgap reference generators.

BACKGROUND

Some systems use bandgap reference generators to generate either a current or voltage (or both) which is used as a reference for various components and is expected to be the same across temperature and power supply voltage. Since the bandgap reference generators produce reference currents and voltages, it may be desirable to calibrate bandgap reference generators so that the output of the bandgap generators precisely matches desired targets.

One example uses an off-line calibration technique during manufacture. The technique includes an external automated test equipment (ATE) to receive a voltage from a bandgap generator. The bandgap generator may be controlled by applying codes, which change the output of the bandgap reference generator by, for example, adjusting an output voltage up or down. The purpose of the calibration is to find a calibration code that matches a target voltage.

Continuing with the example, the technique applies a first calibration code at or near a lowest end of calibration codes and applies a second calibration code at or near a highest end of calibration codes. This is a coarse measurement, which gives a rough evaluation of a slope of calibration codes versus bandgap voltage. The technique then uses that rough evaluation of slope to estimate a first potential target code and a second potential target code. The technique applies the first potential target code and the second potential target code to the bandgap voltage generator and measures the resulting voltages. Based on these resulting voltages, the technique identifies a final target code, which sets the bandgap voltage as close as possible to the target voltage.

The example technique further blows fuses in the product chip to permanently store the target code. During mission mode of the product chip, the chip applies the saved target code to the bandgap generator to cause the bandgap generator to provide the calibrated voltage.

However, this technique may be less than desirable for some applications. Specifically, in some instances, time at an ATE may be expensive, and the example technique above uses four measurements to find the target code. If each measurement uses multiple milliseconds, and the manufacturing process may handle millions of product chips, the milliseconds may add up to noticeable cost. And each fuse may take up chip area and use ATE time to blow. Accordingly, there is a need in the art to reduce or eliminate ATE costs, especially for bandgap calibration.

SUMMARY

Various implementations are directed to circuits and methods that calibrate bandgap current or voltage while reducing or eliminating ATE costs. One example technique includes an in-line process using a feedback loop on the product chip. The feedback loop may include an analog-to-digital converter (ADC) that receives an output from the bandgap generator and then provides a digital code indicative of the measured current or voltage to calibration logic. Therefore, the calibration may be done on the chip and may even omit external ATE, at least for bandgap calibration.

Furthermore, various example implementations may benefit from prior statistical analysis that measures a linear relationship between a measured bandgap voltage and a least significant bit (LSB) size of the bandgap generator. With that relationship known and stored to the chip, the calibration logic may calculate the LSB size using a single reference voltage level value and then calculate a target code from the LSB size and the reference voltage level value.

According to one implementation, a system includes a bandgap voltage generator coupled to a voltage supply and configured to produce a plurality of reference voltage levels in response to a plurality of calibration codes, an analog-to-digital converter (ADC) coupled to a reference voltage output of the bandgap voltage generator, a logic circuit coupled to an output of the ADC, a first memory element coupled to the logic circuit and configured to store a calibration coefficient indicative of a relationship of the calibration codes and the reference voltage levels, and a second memory element coupled to the logic circuit and configured to store a value of a first reference voltage level for the reference voltage output, wherein the logic circuit is configured to generate a first calibration code from the value of the first reference voltage level and the calibration coefficient.

According to another implementation, a method includes storing a calibration coefficient indicative of a relationship of a plurality of calibration codes versus a plurality of reference voltage levels, storing a value of a first reference voltage level for a bandgap voltage generator, applying a first calibration code to the bandgap voltage generator, detecting a second reference voltage level resulting from the first calibration code, generating a second calibration code from the value of the first reference voltage level, the calibration coefficient, and the second reference voltage level, and applying the second calibration code to the bandgap voltage generator.

According to another implementation, a system on chip (SOC) includes means for generating a plurality of reference voltage levels in response to a plurality of calibration codes, means for producing a digital value representing a voltage output of the generating means, means for storing a calibration coefficient indicative of a relationship of a least signification bit size of the calibration codes and the reference voltage levels, means for storing a value of a first reference voltage level for the reference voltage output, and means for calculating a first calibration code from the value of the first reference voltage level and the calibration coefficient and for applying the first calibration code to the generating means.

According to yet another implementation, a chip includes a bandgap reference generator configured to produce a plurality of reference signal levels in response to a plurality of calibration codes, an analog-to-digital converter (ADC) coupled to a reference signal output of the bandgap reference generator, a logic circuit coupled to an output of the ADC, a first memory element coupled to the logic circuit and configured to store a calibration coefficient indicative of a relationship of a least significant bit size of the calibration codes and the reference signal levels, and a second memory element coupled to the logic circuit and configured to store a value of a first reference signal level for the reference signal output, wherein the logic circuit is configured to generate a first calibration code from the value of the first reference signal level and the calibration coefficient.

DETAILED DESCRIPTION

Figure 1:
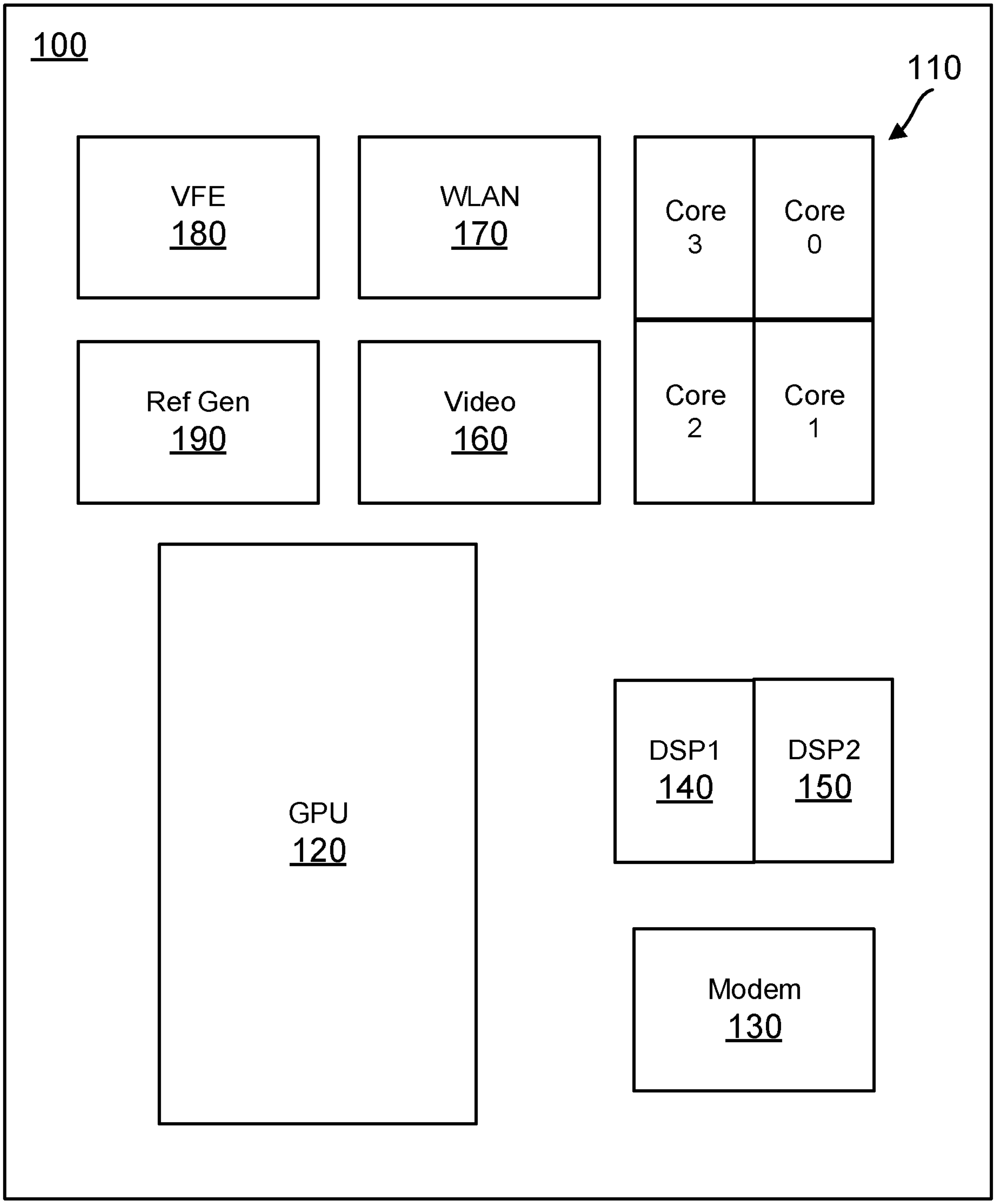
FIG. 1 is an illustration of an example computing device that may perform a method according to various implementations.

Various implementations provided herein include circuits and methods to calibrate bandgap reference generators using an in-line technique and by taking advantage of a relationship between a measured bandgap voltage and a least significant bit (LSB) size.

An example implementation includes a bandgap reference generator coupled to a voltage supply (e.g., $V_{CC}$) to produce a voltage—a bandgap voltage generator. The bandgap voltage generator has voltage adjustment circuitry that receives a binary calibration code and sets a reference voltage level at the output of the bandgap voltage generator based on the binary calibration code. In other words, the bandgap voltage generator may produce any one of a plurality of reference voltage levels based on anyone of the plurality of received binary calibration codes.

Continuing with this example, the bandgap voltage generator may also be coupled to an analog-to-digital converter (ADC) at its reference voltage output. In other words, the ADC may receive the reference voltage level from the bandgap voltage generator and then generate a digital code based on the reference voltage level. The example implementation may also include a logic circuit that is coupled to an output of the ADC to receive the digital code that indicates the reference voltage level. As explained further below, the logic circuit may be configured to calibrate the bandgap voltage generator based, at least in part, on the output of the bandgap voltage generator as observed by the ADC.

Further in this example, the system may include a first memory element, such as a register, which is coupled to the logic circuit and stores a calibration coefficient. The system may also include a second memory element which is coupled to the logic circuit and configured to store a value of a target reference voltage level. The inventors have observed that there is a statistical relationship between an observed reference voltage value and a least significant bit (LSB) size of the bandgap voltage generator. Specifically, the inventors have discovered that the statistical relationship is a linear relationship and that for the same binary calibration code applied to the bandgap core, a higher observed reference voltage value corresponds to a greater LSB size and that a lower observed reference voltage value corresponds to a lesser LSB size. An example calibration coefficient includes the value of LSB size over observed reference voltage, and it may be determined through simulation or experimentation. Continuing with the example, the first memory element may store the calibration coefficient, which is indicative of the LSB size. The second memory element may store the value for the target reference voltage level, which is a desired reference voltage level in this example.

During calibration, the logic circuit may apply a calibration code to the bandgap reference generator. In some implementations, the calibration code may include a mid-range calibration code. For instance, a mid-range calibration code may be selected from at or near a midpoint of a set of available calibration codes. Thus, in one example, if there are 30 available calibration codes, then the mid-range calibration code may include the $15^{th}$ or the $16^{th}$ calibration code of the set. Another example, if there are 29 calibration codes, then the mid-range calibration code may include the $15^{th}$ calibration code of the set. Of course, various implementations may select the calibration code from any appropriate portion of the set of available calibration codes.

After the calibration code is applied to the bandgap voltage generator, the bandgap voltage generator outputs a reference voltage level, which is detected by the ADC. The ADC detects the voltage level and produces a digital value representing the voltage level. The logic circuit receives the digital value from the ADC and performs a mathematical function using the ADC output and the calibration coefficient (e.g., multiplying the calibration coefficient by the digital value from the ADC) to calculate the LSB size. The logic circuit also calculates a difference between the detected reference voltage level and the target reference voltage level, which is stored in the second memory element. The logic circuit then calculates a number of calibration codes to either count up or count down, according to the LSB size, from the applied calibration code to reach the target voltage level. In this manner, the resulting calibration code corresponds to the target reference voltage level (a target calibration code).

Various implementations may be performed by hardware and/or software in a computing device. For instance, some implementations include register transfer level (RTL) hardware for the logic circuit so that the logic is built into the chip and is relatively quick in operation. In other examples, the functionality of the logic circuit may be implemented using firmware and/or software. Various implementations may further include nonvolatile or volatile memory set aside in an integrated circuit chip in a computing device to store the set of available calibration codes or other appropriate information.

An advantage of some implementations described above is that they may reduce or eliminate ATE costs and they may reduce or eliminate the use of fuses to store the ATE measurement result, at least for bandgap calibration. In contrast to some traditional uses, various implementations described herein may perform an in-line calibration that uses and on-chip ADC and logic circuit rather than relying on an external ATE. In this example, in-line calibration refers to the on-chip feedback loop, which performs the calibration. As noted above, ATE time may be costly, so that various implementations may reduce cost during manufacture of chips having bandgap reference generators. Furthermore, in implementations which eliminate use of an external ATE in favor of an on-chip measurement, the calibration technique may be performed at desirable times (e.g., boot up) other than manufacture. Independently from that, various implementations calculate the target calibration code by using one sample measurement (e.g., at a mid-range calibration code), which may be more efficient than using four separate measurements, as in some traditional techniques.

FIG. 1 is an illustration of example SOC 100, according to one implementation. In this example, SOC 100 is implemented on a semiconductor die, and it includes multiple system components 110-190. Specifically, in this example, SOC 100 includes central processing unit (CPU) 110 that is a multi-core general-purpose processor having four processor cores, core 0-core 3. Of course, the scope of implementations is not limited to any particular number of cores, as other implementations may include two cores, eight cores, or any other appropriate number of cores in the CPU 110. SOC 100 further includes other system components, such as a first digital signal processor (DSP) 140, a second DSP 150, a modem 130, graphics processing unit (GPU) 120, a video subsystem 160, a wireless local area network (WLAN) transceiver 170, and a video-front-end (VFE) subsystem 180.

SOC 100 also includes reference generator 190, which in this example includes a bandgap reference generator. Reference generator 190 supplies reference currents and reference voltages to different components on SOC 110. For instance, each of the different components 110-180 may include various subcomponents that use a reference voltage or reference current. Examples of subcomponents that may use a reference voltage or a reference current include low dropout (LDO) voltage regulators, ADCs, current mode logic (CML) buffers, phase locked loops (PLLs), delay locked loops (DLLs), amplifiers, filters, and various loads. Such subcomponents are not explicitly shown in FIG. 1, but it is understood that the SOC of FIG. 1 would be expected to include multiple subcomponents employing reference voltages or currents.

Reference generator 190 not only supplies reference currents and voltages to the components on the SOC 110, but it also performs a calibration as described in more detail below.

Figure 2:
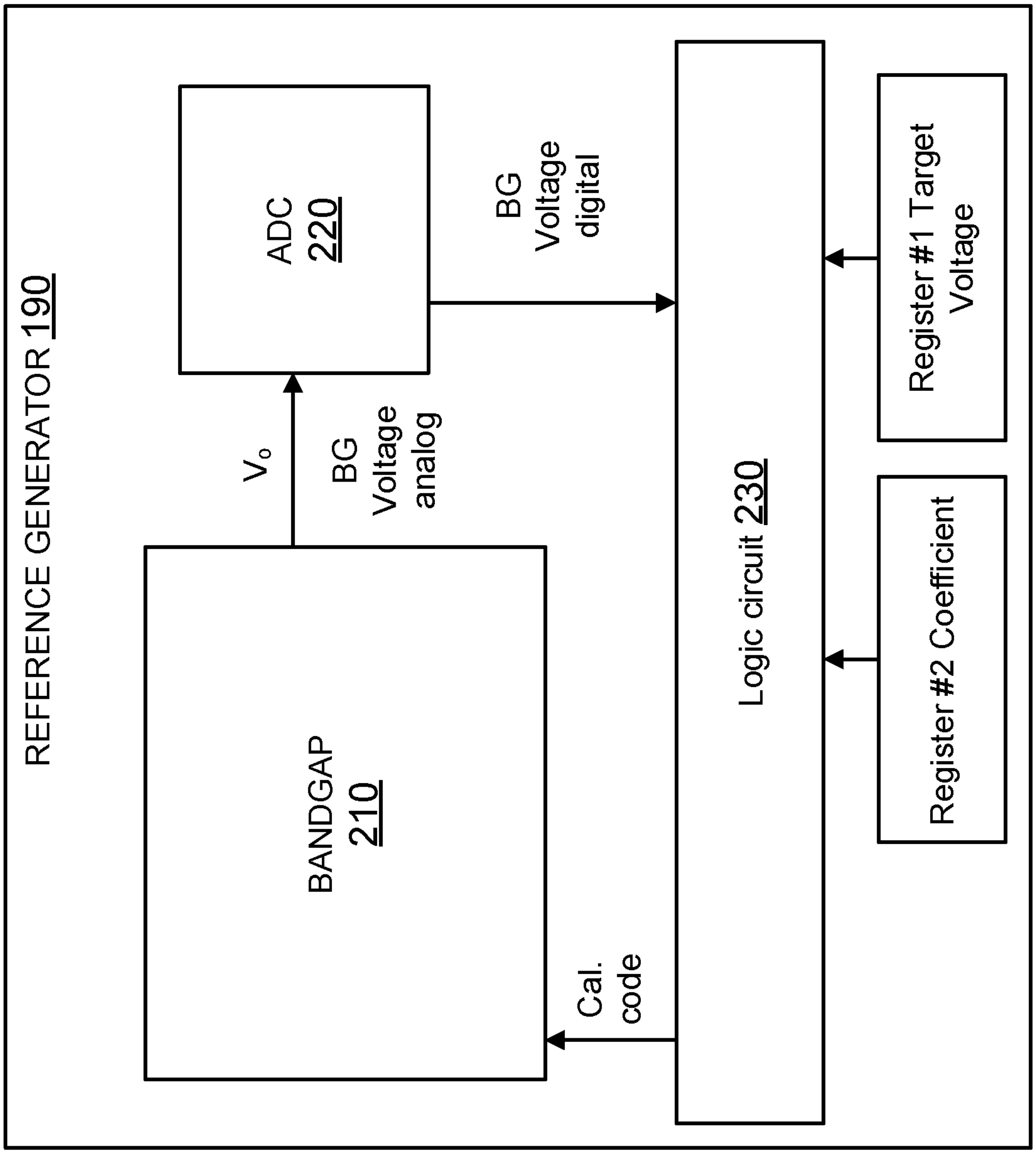
FIG. 2 is an illustration of an example reference generator of the computing device of FIG. 1, according to one implementation.
Figure 3:
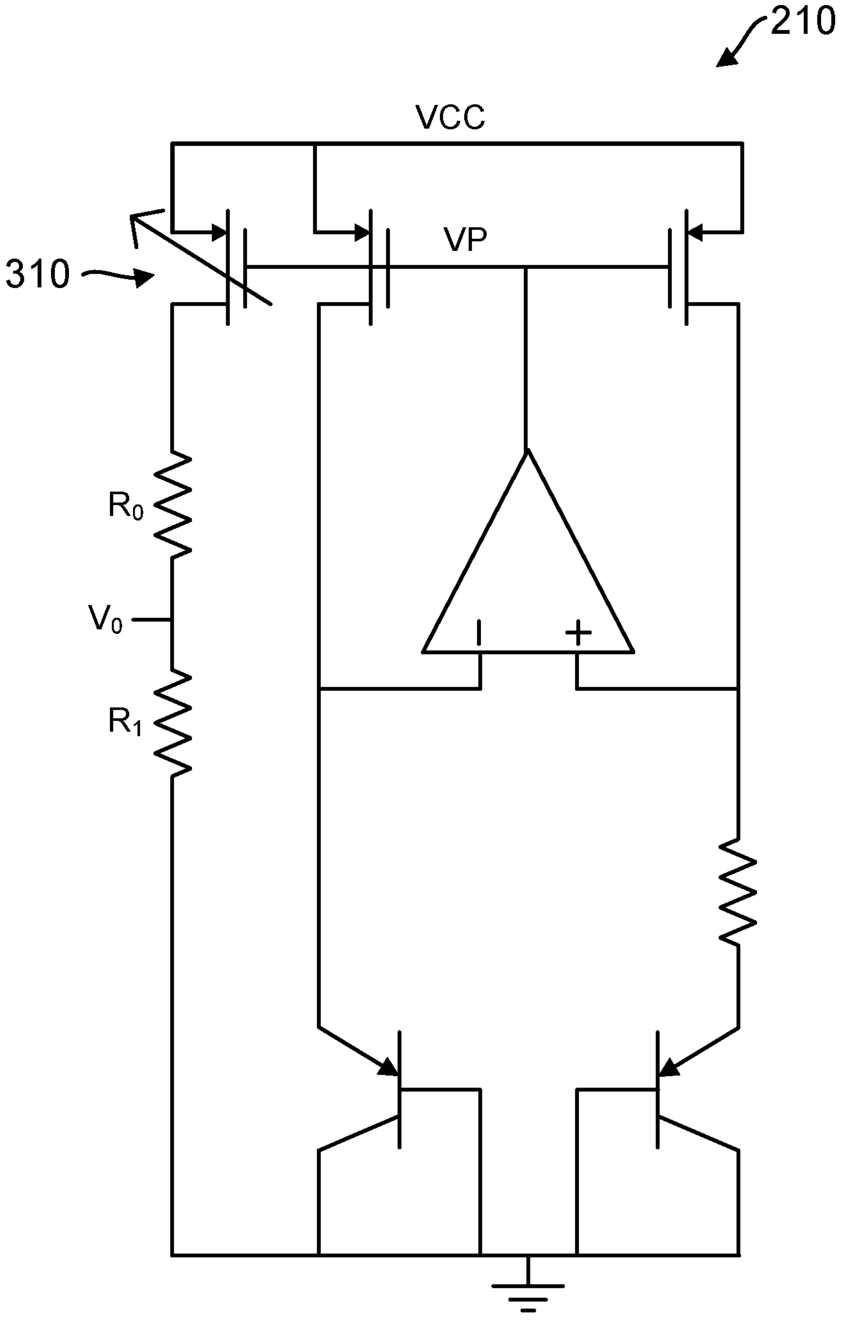
FIG. 3 is an illustration of an example bandgap reference generator that may be included in the computing device of FIG. 1 and the reference generator of FIG. 2, according to one implementation.

FIG. 2 illustrates an example reference generator 190 according to one implementation. Reference generator 190 includes a feedback loop to calibrate bandgap voltage generator 210. Bandgap voltage generator 210 may include any appropriate bandgap circuit architecture, an example of which is shown in FIG. 3. Bandgap voltage generator 210 has a reference voltage output, and the reference voltage is represented by $V_O$. The reference voltage output level is determined by a calibration code, which is applied to the bandgap voltage generator 210 by the logic circuit 230. As mentioned above, the logic circuit 230 can be implemented using hardware (e.g., digital logic circuits, finite state machines, etc.), software, firmware, and/or a combination of any of the above.

Looking at FIG. 3, it shows an example bandgap circuit architecture, according to one implementation. Specifically, FIG. 3 shows one way to implement the bandgap voltage generator 210 of FIG. 2. Bandgap voltage generator 210 is coupled to a voltage supply $V_{CC}$ at one end and ground at the other. Reference voltage output $V_O$ is positioned on a branch that receives current from the voltage adjustment circuit 310. Resistors $R_0$-$R_1$ act as a resistor divider so that the reference voltage level seen at $V_O$ depends on the current from the voltage adjustment circuit 310 and the values of these resistors. Other implementations may use different arrangements of resistors (such as omitting $R_0$). In short, more current generates a higher voltage through the fixed resistors $R_0$-$R_1$. The particular architecture shown in FIG. 3 is designed to be relatively stable throughout different temperature ranges and throughout different power supply ranges, thereby providing a stable output for $V_O$ for a given calibration code.

Figure 4:
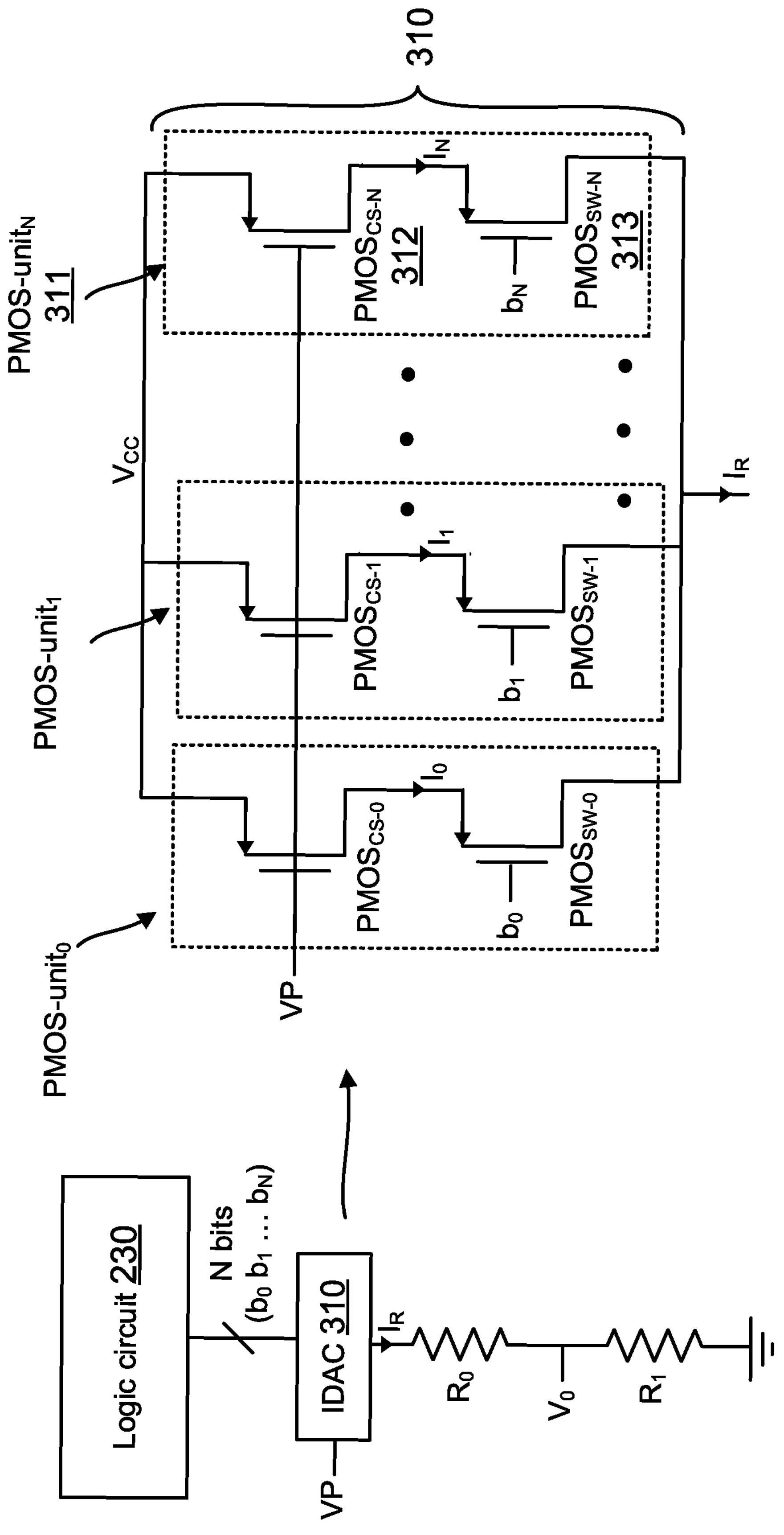
FIG. 4 is an illustration of an example adjustment circuit that may be used in the bandgap reference generator of FIG. 3, according to one implementation.

FIG. 4 is an illustration of an example voltage adjustment circuit 310, according to one implementation. Voltage adjustment circuit 310 includes a plurality of PMOS unit cells 311, shown in this example as PMOS $unit_0$-PMOS_$unit_N$, where N can be any appropriate integer so that the total number of PMOS units is greater than one. Each of the PMOS units includes at least one PMOS transistor that can be turned on or off, thereby transmitting current or preventing current from flowing. One example of such an implementation is shown in FIG. 4. Each PMOS unit 311 may include a stack of two PMOS transistors. The first PMOS transistor 312 can be used as a voltage-controlled current source with $V_P$ as control voltage. The second PMOS transistor 313 can be turned on and off, thereby transmitting current or preventing current from flowing. The output current of a variable number of PMOS-units are combined together to form a total current $I_R$ into resistors $R_0$ and $R_1$. The portion of the bandgap voltage generator 210 including the resistor divider having resistors $R_0$-$R_1$ is shown coupled to the PMOS units for reference, and other portions of the bandgap voltage generator 210 are omitted for ease of illustration.

In one example, each of the transistors in the PMOS units 311 are the same so that each unit is the same. In another example, each PMOS unit has a respective size so that a larger transistor 312 may generate more current than a smaller transistor 312. The transistors may be arranged from largest to smallest so that the largest of the transistors 312 corresponds to a most significant bit and the smallest of the transistors corresponds to a least significant bit. Voltage adjustment circuit 310 is in communication with the logic circuit 230 to receive calibration codes at the PMOS units 311 and, specifically, at the gate terminal of the transistors 313. In this example, the calibration code is a digital binary code $b_0$ to $b_N$, and the PMOS-units 311 are configured as a current digital-to-analog converter (IDAC).

In this example, the PMOS units 311 are arranged so that PMOS-$unit_0$ receives a least significant bit $b_0$ and PMOS-$unit_N$ receives a most significant bit of the calibration code $b_N$ to control the gate terminal of each device $PMOS_{SW}$. Thus, a binary 0 at a given unit will turn that unit on and allow current to flow through it, whereas a binary 1 at the same unit will turn that unit off and prevent current generated by 312 from flowing through it. In this manner, each calibration code corresponds to a particular output current $I_R$ and, therefore, to a particular reference voltage level at $V_O$. The voltage level at $V_O$ is determined by the calibration code applied to the PMOS units, and logic circuit 230 may change the reference voltage level at $V_O$ by changing the calibration code.

Of course, the scope of implementations is not limited to the particular voltage adjustment circuit architecture of FIG. 4. Rather, other implementations may use different kinds of transistors. For instance, in alternative implementation may use NMOS units, where each unit is turned on by receiving a binary 1 at the gate terminal and is turned off by receiving a binary 0 and the gate terminal.

Returning to FIG. 2, ADC 220 receives the reference voltage and generates a digital output representative of the level of the reference voltage. In this example, ADC 220 acts as a voltmeter, though ADC 220 may be part of a larger embedded device, which may measure current, impedance, or other desired characteristic.

The logic circuit 230 receives the digital output from the ADC and accesses register #1 and register #2 to read the stored target voltage and calibration coefficient, respectively. As explained in more detail below, the logic circuit 230 calculates a calibration code to cause the bandgap voltage generator 210 to output the target voltage level at $V_O$.

In the example of FIG. 2, the bandgap voltage generator 210 and the set of available calibration codes are designed so that the mid-range code corresponds to the target voltage, at least in simulation. However, process variation and mismatch within a manufactured SOC may cause the bandgap voltage generator 210 to be somewhat different from its ideal, simulated self. In one example, the bandgap voltage generator 210 includes an operational amplifier, which is made of numerous transistors, and process variation within the operational amplifier may cause the bandgap voltage generator 210 to have a voltage output that is slightly higher or slightly lower from what simulation would show. Thus, the calibration process reduces or eliminates the effects of process variation and mismatch by adjusting the behavior of the bandgap voltage generator 210.

Logic circuit 230 applies the mid-range calibration code to the bandgap voltage generator 210, and the bandgap voltage generator 210 outputs a voltage at $V_O$. ADC 220 receives the analog voltage from $V_O$ and generates a digital code indicative of the measured voltage resulting from the mid-range calibration code. Various implementations may format the digital code in any appropriate manner. For instance, some implementations may include any appropriate resolution (e.g., 4-bits or 16-bits) to indicate the resulting reference voltage level at $V_O$.

The logic circuit 230 receives the digital code from ADC 220 and generates a calibration code according to the algorithm described herein. In this example, the reference generator 190 stores a target voltage value at register #1 and a calibration coefficient at register #2. The target voltage value indicates a desired voltage level for the voltage output at $V_O$, and the target voltage level may differ from the observed voltage level resulting from the mid-range calibration code.

Register #2 stores a calibration coefficient. As noted above, the inventors have discovered a linear relationship between the least significant bit (LSB) size of IDAC 310 and the bandgap voltage level $V_O$ at the mid-range calibration code. Such relationships are shown in FIGS. 5 and 6.

Figure 5:
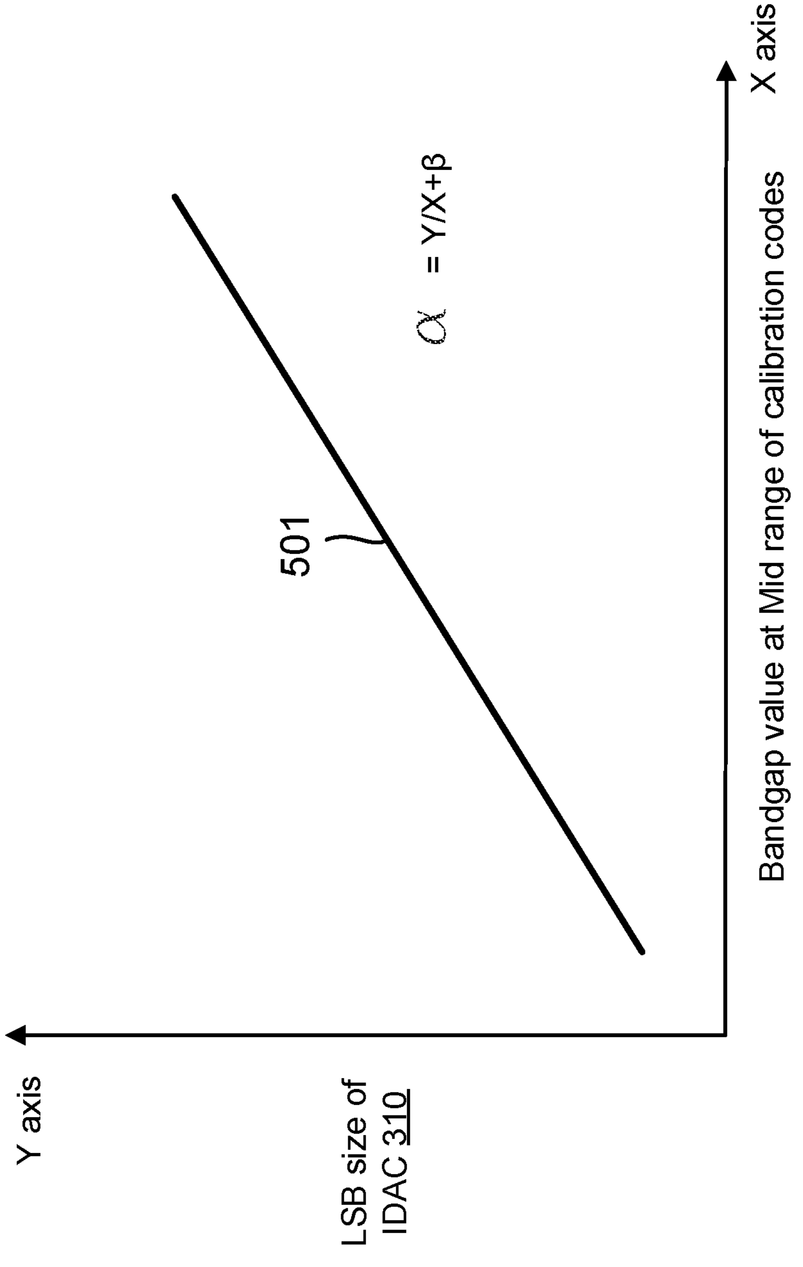
FIG. 5 is an illustration of an example relationship between measured bandgap voltage and LSB size, according to one implementation.

Looking first at FIG. 5, line 501 shows the linear relationship between the LSB size of IDAC 310 and the voltage level resulting from the mid-range calibration code. For the purposes of these examples, the calibration coefficient will be referred to as alpha (a). In FIG. 5, the LSB size of IDAC 310 is on the Y-axis, and the voltage level resulting from the mid-range calibration code is on the X-axis. The linear relationship is indicated by a, which is equal to the LSB size of IDAC 310 divided by the voltage level from the mid-range calibration code. Note that this linear relationship 510 may have an offset β as shown in FIG. 5.

The inventors have also discovered that the linear relationship should be the same for similar chips, although it can be different for different chips. In other words, for a same model chip produced by a same chip fabricator, a should be substantially the same. Accordingly, once a is known from either simulation or experimentation, a can be saved to register #2 for each of the chips that are produced.

Figure 6:
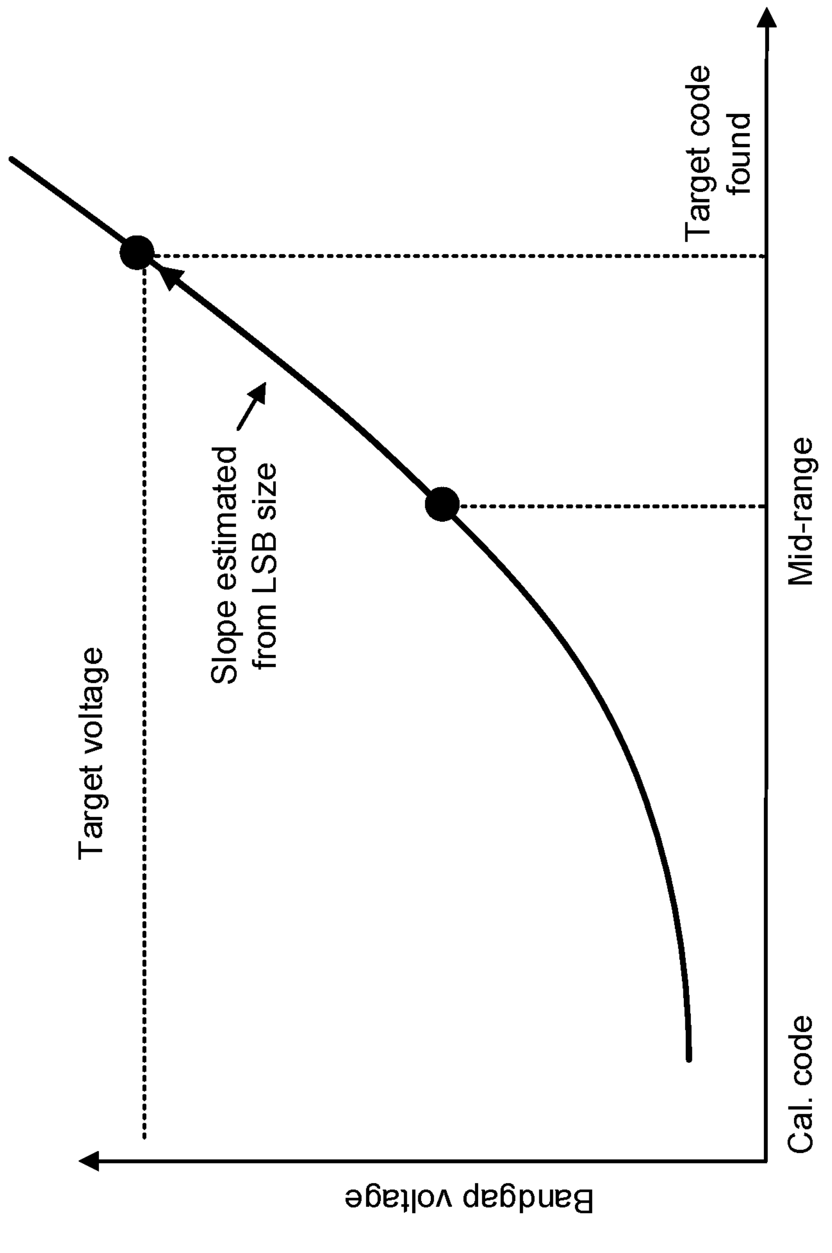
FIG. 6 is an illustration of an example relationship between calibration codes and bandgap voltage values, according to one implementation.

Now looking to FIG. 6, it is a graph showing the relationship between calibration code and reference voltage level at $V_O$ (the output voltage or bandgap voltage). The set of calibration codes is finite, and in various implementations may include any appropriate number of calibration codes to achieve a desired level of granularity for the reference voltage level at $V_O$. For instance, in some implementations it is desirable to have the level of granularity of ADC 220 be the same as or greater than the level of granularity offered by the finite set of calibration codes so that a difference between the voltage level resulting from the mid-range calibration code and a target voltage level may be calculated at a precision that can be addressed by the calibration codes.

While the curve of calibration code versus bandgap voltage in FIG. 6 is not exactly linear, it is approximately linear at least at the midrange value (the voltage level resulting from the mid-range calibration code). Thus, each calibration code step around the midrange value should provide approximately the same amount of voltage increase or decrease. The calibration algorithm calculates a target calibration code as a number of steps difference, according to the LSB size, between the voltage level resulting from the mid-range calibration code and the target voltage level. Note that the voltage relationships shown in FIGS. 5-6 are meant to be examples only. The architecture can be applied to situations where there are voltage relationships different from those shown, such as examples with a different α or a different β.

Now looking at FIGS. 2 and 6 together, the logic circuit 230 has received the midrange value as a digital code. The logic circuit 230 also has access to the target voltage value from register #1 and the calibration coefficient α from register #2. The logic circuit 230 calculates a difference between the midrange value and the target voltage level. The logic circuit 230 may also calculate the LSB size of the calibration code in the bandgap voltage curve shown in FIG. 6 around the midrange value by multiplying a by the midrange value. Once the difference is known and once the LSB size is known, the logic circuit 230 can calculate a number of calibration code steps to either add or subtract from the mid-range calibration code to result in the target voltage value. The logic circuit 230 then adds or subtracts that number of code steps to generate the target calibration code. The logic circuit 230 then applies the target calibration code to the bandgap voltage generator 210 as described above in more detail with respect to FIG. 4.

Although not shown explicitly in FIG. 2, the output of the bandgap voltage generator 210 may then be supplied to various subcomponents on an SOC, as discussed above with respect to FIG. 1. The output of the bandgap voltage generator 210 may be used as a reference voltage throughout the SOC because it is expected to be precisely calibrated and stable over a variety of operating conditions, such as temperature and power supply voltages.

Various implementations may include one or more advantages over traditional systems. For instance, some traditional systems may rely on fuses to set a calibration code during manufacture. While that might be acceptable for some applications, some chips may change their performance as they age or in different operating conditions (e.g., temperature), so that a fused-in calibration might result in a different reference voltage level from the target voltage level.

By contrast, various implementations are not limited to performing calibration during manufacture. Therefore, calibration may be performed at any appropriate time, such as at boot up of the chip, at periodic time intervals, and/or the like. Accordingly, various implementations may perform calibration that is appropriate for a particular chip age and operating condition so that precise reference voltage levels are achieved.

Also, various implementations may eliminate the use of external ATE for bandgap reference generator calibration. For instance, some traditional systems rely on external ATE to calibrate bandgap reference generators on a chip, but external ATE time may be valuable and is typically only available during manufacture. By contrast, various implementations perform calibration using an ADC on the chip itself so that external ATE time may be unneeded. Nevertheless, the scope of implementations does not prohibit the use of external ATE for either bandgap calibration or other uses. In other words, some implementations provide the flexible option of performing bandgap reference calibration on-chip and/or off-chip.

Furthermore, various implementations may be more efficient in calculating a target calibration code than in traditional systems. For instance, some traditional systems may use four or more voltage measurements to identify a target calibration code. By contrast, various implementations may identify a target calibration code using only a single voltage measurement. In other words, various implementations may perform the calibration more quickly than in traditional systems, thereby saving time and cost. In fact, the single-voltage measurement technique may be applied in a system that uses an external ATE to reduce the amount of ATE time that would otherwise be used to perform the additional voltage measurements.

Figure 7:
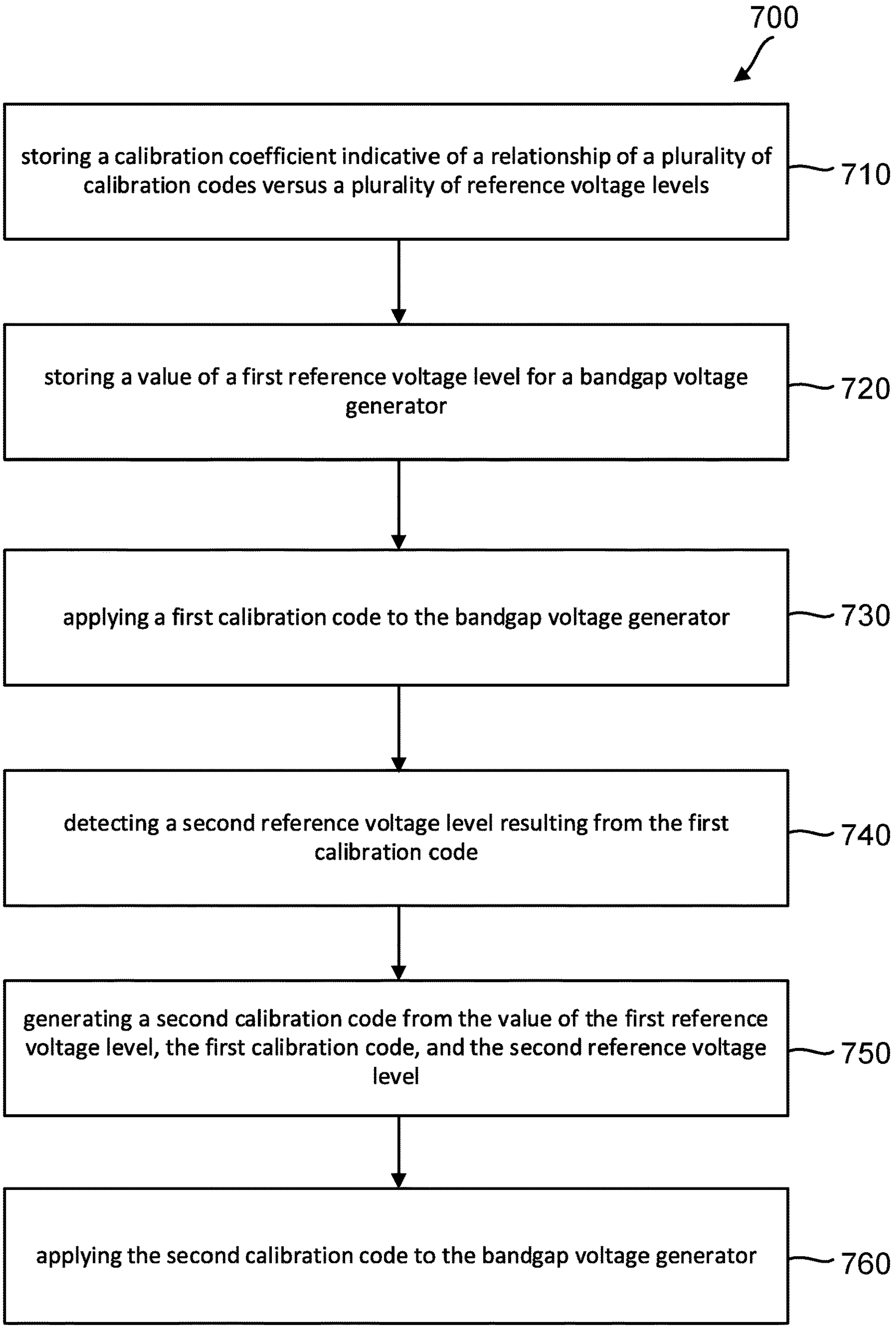
FIG. 7 is an illustration of a flow diagram of an example method of calibrating a bandgap reference generator, according to one implementation.

A flow diagram of an example method 700 for calibrating a bandgap reference generator is illustrated in FIG. 7. In one example, method 700 is performed by reference generator 210 of FIG. 2. Hardware or software logic, such as logic circuit 230 of FIG. 2 may perform calculations and apply a calibration code to a bandgap reference generator. In the example of FIG. 2, the logic circuit 230 may be implemented using RTL, though in other implementations the functionality of logic circuit 230 may be implemented by processing circuitry that executes firmware or software code stored to a computer-readable medium.

At action 710, the reference generator stores a calibration coefficient. The calibration coefficient may indicate a relationship of a plurality of calibration codes versus a plurality of reference voltage levels and, more specifically, a linear relationship between the bandgap voltage values and the LSB of the calibration codes. For instance, that linear relationship may be expressed as a coefficient. An example coefficient, a, was discussed above with respect to FIG. 5.

At action 720, the reference generator stores a value of a first reference voltage level for a bandgap voltage generator. An example first reference voltage level includes a target reference voltage level for $V_O$ of FIG. 1.

With respect to actions 710 and 720, the calibration coefficient and the value of the first reference voltage may be stored in any appropriate memory structure, such as registers. Example registers are shown in FIG. 2 as register #1 and register #2. In some examples, the registers may be small so as to only store a single coefficient or a single target voltage value, though the scope of implementations includes any appropriate size for the registers.

At action 730, the reference generator applies a first calibration code to the bandgap voltage generator. An example of a calibration code that may be applied at action 730 includes a mid-range calibration code. Of course, the scope of implementations is not limited to applying mid-range calibration codes only. Rather, other implementations may apply a calibration code from anywhere within a set of calibration codes. In the examples given above, the calibration coefficient $\alpha$ is derived from a linear relationship between a mid-range reference voltage value and the LSB size of the calibration code.

Action 730 may also include the bandgap voltage generator generating a reference voltage level in response to the first calibration code. Taking FIG. 2 as an example, the reference voltage level would be generated at $V_O$. $V_O$ is at an output of the bandgap voltage generator 210 and at an input of the ADC 220.

At action 740, the reference generator detects a second reference voltage level resulting from the first calibration code. For instance, the second reference voltage level may include the reference voltage level that results from applying the mid-range calibration code.

Action 740 may be performed by an ADC, such as ADC 220. Action 740 may include the ADC measuring the second reference voltage and outputting a digital code indicative of the second reference voltage level.

At action 750, the reference generator generates a second calibration code. For instance, the logic circuit 230 of FIG. 2 may generate a target calibration code that corresponds to a target reference voltage level (e.g., the first reference voltage level of action 720).

The reference generator generates the second calibration code from the value of the first reference voltage level (at action 720), the first calibration code (at action 710), and the second reference voltage level (at action 740). An example is described above in which logic circuit 230 calculates a value for LSB size by multiplying the calibration coefficient by the second reference voltage level. Continuing with that example, the logic circuit 230 also calculates a difference between the first reference voltage level (the target reference voltage level) and the second reference voltage level (the mid-range reference voltage level). In one example, the value of the LSB size is volts per calibration code step, and the logic circuit 230 may calculate a number of calibration code steps to add to or subtract from the first calibration code based on the LSB size and the difference. Logic circuit 230 may then generate the second calibration code by adding or subtracting calibration code steps from the from the first calibration code.

At action 760, the reference generator applies the second calibration code to the bandgap voltage generator. In one example, the calibration codes are binary numbers (i.e., ones and zeros), and each digit of the calibration code is applied to a gate terminal of a corresponding transistor, such as described above at FIG. 4. The ones and zeros cause some transistors to be on and others to be off, thereby resulting in a current that passes through a voltage divider and produces a reference voltage value that is designed to be substantially the same as the target reference voltage level (the first reference voltage level of action 720). Any deviation from the target reference voltage level may be attributable to a number of digits for the code generated by the ADC and the number of available calibration code steps, both of which can be designed into the system to achieve a desired precision for a particular application.

The scope of implementations is not limited to the actions shown in FIG. 7. Rather, various implementations may add, omit, rearrange, or modify various actions. For instance, some implementations may include repeating the calibration as temperature changes, at periodic times, or at other appropriate instances to ensure precise calibration. In fact, the calibration technique may be performed at manufacture, during mission mode, or at any other appropriate time. The scope of implementations is not limited to a reference voltage generator, as the principles herein may be applied to any a bandgap reference generator configured to produce a plurality of reference signal levels (current or voltage) in response to a plurality of calibration codes.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A system comprising:

a bandgap voltage generator coupled to a voltage supply (VCC) and configured to produce a plurality of reference voltage levels in response to a plurality of calibration codes;

an analog-to-digital converter (ADC) coupled to a reference voltage output of the bandgap voltage generator;

a logic circuit coupled to an output of the ADC;

a first memory element coupled to the logic circuit and configured to store a calibration coefficient indicative of a relationship of the calibration codes and the reference voltage levels; and a second memory element coupled to the logic circuit and configured to store a value of a first reference voltage level for the reference voltage output, wherein the logic circuit is configured to generate a first calibration code from the value of the first reference voltage level and the calibration coefficient.

2. The system of claim 1, wherein the logic circuit is further configured to generate the first calibration code from a second calibration code and a corresponding second reference voltage level.

3. The system of claim 2, wherein the second calibration code comprises a mid-range calibration code.

4. The system of claim 1, further comprising voltage adjustment circuitry coupled to the logic circuit, the voltage adjustment circuitry being configured to set the value of the first reference voltage level according to the first calibration code.

5. The system of claim 4, wherein the voltage adjustment circuitry comprises a digital-to-analog converter.

6. The system of claim 1, wherein the first memory element comprises a register configured to hold a single calibration coefficient.

7. The system of claim 1, wherein the second memory element comprises a register configured to hold a single reference voltage level value.

8. The system of claim 1, wherein the bandgap voltage generator, the ADC, and the logic circuit comprise a feedback loop implemented on a same system on chip (SOC).

9. The system of claim 1, wherein the calibration coefficient represents a linear relationship of a second reference voltage level to a least significant bit size of the bandgap voltage generator.

10. A method comprising:

storing a calibration coefficient indicative of a relationship of a plurality of calibration codes versus a plurality of reference voltage levels;

storing a value of a first reference voltage level for a bandgap voltage generator;

applying a first calibration code to the bandgap voltage generator;

detecting a second reference voltage level resulting from the first calibration code;

generating a second calibration code from the value of the first reference voltage level, the calibration coefficient, and the second reference voltage level; and applying the second calibration code to the bandgap voltage generator.

11. The method of claim 10, wherein generating the second calibration code comprises:

calculating a value for a least significant bit size of the bandgap voltage generator from the second reference voltage level and the calibration coefficient; and calculating a number of calibration code steps to add or subtract to the first calibration code based on the value for the least significant bit size and a difference between the first reference voltage level and the second reference voltage level.

12. The method of claim 10, wherein the first calibration code comprises a digital binary code, and wherein the bandgap voltage generator receives the digital binary code at a digital-to-analog converter (DAC) in communication with a voltage output of the bandgap voltage generator.

13. The method of claim 10, wherein the second calibration code comprises a digital binary code, and wherein the bandgap voltage generator receives the digital binary code at a digital-to-analog converter (DAC) in communication with a voltage output of the bandgap voltage generator.

14. The method of claim 10, wherein the first reference voltage level comprises a target reference voltage level for a system on chip (SOC).

15. The method of claim 10, wherein the method is performed at boot up of a system on chip (SOC) that comprises the bandgap voltage generator.

16. The method of claim 10, wherein the calibration coefficient represents a linear relationship of the second reference voltage level to a least significant bit size of the bandgap voltage generator.

17. A system on chip (SOC) comprising:

means for generating a plurality of reference voltage levels in response to a plurality of calibration codes;

means for producing a digital value representing a voltage output of the generating means;

means for storing a calibration coefficient indicative of a relationship of a least significant bit size of the calibration codes and the reference voltage levels;

means for storing a value of a first reference voltage level for the reference voltage output; and means for calculating a first calibration code from the value of the first reference voltage level and the calibration coefficient and for applying the first calibration code to the generating means.

18. The SOC of claim 17, further comprising means for setting the value of the first reference voltage level according to the first calibration code.

19. The SOC of claim 17, wherein the generating means comprise a bandgap reference generator.

20. The SOC of claim 17, wherein the means for producing the digital value comprise an analog-to-digital converter (ADC).

21. A chip comprising:

a bandgap reference generator configured to produce a plurality of reference signal levels in response to a plurality of calibration codes;

an analog-to-digital converter (ADC) coupled to a reference signal output of the bandgap reference generator;

a logic circuit coupled to an output of the ADC;

a first memory element coupled to the logic circuit and configured to store a calibration coefficient indicative of a relationship of a least significant bit size of the calibration codes and the reference signal levels; and a second memory element coupled to the logic circuit and configured to store a value of a first reference signal level for the reference signal output, wherein the logic circuit is configured to generate a first calibration code from the value of the first reference signal level and the calibration coefficient.

22. The chip of claim 21, wherein the logic circuit is further configured to generate the first calibration code from a second calibration code and a corresponding second reference signal level.

23. The chip of claim 22, wherein the second calibration code comprises a mid-range calibration code.

24. The chip of claim 21, wherein first reference signal level comprises a voltage.

* * * * *